United States Patent [19]

Sterczyk

[11] Patent Number: 5,269,452
[45] Date of Patent: Dec. 14, 1993

[54] METHOD AND APPARATUS FOR WIREBONDING

[75] Inventor: Tim Sterczyk, Nepean, Canada

[73] Assignee: Northern Telecom Limited, Montreal, Canada

[21] Appl. No.: 974,653

[22] Filed: Nov. 12, 1992

[51] Int. Cl.$^5$ .......................................... H01L 21/603
[52] U.S. Cl. .................................... 228/49.2; 228/102
[58] Field of Search ............... 228/102, 103, 179, 4.5

[56] References Cited

FOREIGN PATENT DOCUMENTS

| | | | |
|---|---|---|---|
| 164557 | 10/1982 | Japan | 228/179 |
| 62-76730 | 4/1987 | Japan | 228/179 |
| 219133 | 9/1988 | Japan | 228/179 |
| 215139 | 8/1990 | Japan | 228/179 |
| 275647 | 11/1990 | Japan | 228/179 |

*Primary Examiner*—Samuel M. Heinrich
*Attorney, Agent, or Firm*—Angela C. de Wilton

[57] ABSTRACT

A method and apparatus for wirebonding is provided. The apparatus is operable to perform a method of wirebonding leadwires between bond pads of a die of an integrated circuit (IC) and contacts of a leadframe of a IC package, in which the resulting bonded leadwires fan out towards corners of the package, and in which the sequence of formation of wirebonds is selected to minimize wirebonding tool-to-wire interference. In wirebonding a high lead count integrated circuit die to a leadframe of a package in which bonded leadwires fan out at angles approaching 45° near corners of the package, for example as in a quad flat pack (QFP) format, bonding proceeds in sequence along each side to provide bonded leadwires to bond pads in a direction from a corner towards an intermediate position along one side and then from the opposite corner towards the intermediate position, in a direction of decreasing fan out angle. Thus, a previously bonded leadwire is angled away from an adjacent bond pad to which a subsequent leadwire is to be bonded, and access of the bonding tool to an adjacent pad is independent of fan out angle.

11 Claims, 7 Drawing Sheets

METHOD AND APPARATUS FOR WIREBONDING

FIELD OF THE INVENTION

This invention relates to a method and apparatus for wirebonding.

BACKGROUND OF THE INVENTION

Typically, an integrated circuit (IC) on a semiconductor die includes an array of bond pads arranged surrounding the area of the die occupied by components of the IC. The bond pads provide contact areas for wirebonding of leadwires to provide electrical I/O connections from the IC to terminals of an IC package. For example, a high lead count IC may have 256 contact pads arranged around the four sides of a square die for assembly into a package such as a Quad Flat Pack (QFP). As device geometries diminish and integrated circuits become more complex, a larger number of I/O connections are required. The minimum die size for an IC design may be determined primarily by the area taken up by the bond pads, i.e. by the number of bond pads and their arrangement, rather than the dimensions of other components of the integrated circuit, and the minimum die size is said to be "padlimited".

Using known wirebonding apparatus, with a minimum contact pad size of typically $\sim 5$ mil ($\sim 125$ $\mu$m) and a minimum pad pitch typically in the range of 6.5 to 10 mil (165 $\mu$m to 250 $\mu$m), 256 contacts can be accommodated with a die size of $\sim 500 \times 500$ mils ($\sim 12 \times 12$ mm), yielding about 80 dice per 6 inch wafer. By reducing the area taken up by the bonding pads on each die, the number of dice per wafer, and therefore wafer yield, is increased. However, there is a practical limit to reduction of bond pad size and bond pad pitch while maintaining high yield wirebonding capability with conventional wirebonding apparatus.

The minimum bond pad size and the minimum bond pad pitch are primarily determined by the physical dimensions of the wirebonding tool, which also determines the size and form of the wirebond.

To maintain high output of packages per hour, wirebonding speed is an important consideration for high lead count packages. Processing rates of 6 to 7 wires per second (or $\sim 150$ ms per wirebond) may be achieved with known wirebonding apparatus. Known apparatus provides for relative movement of the die and the wirebonding tool in an xy plane parallel to the plane of the die, and in a z direction towards and away from one another, so that the tool may be stepped from one bond pad location to the corresponding individual leadframe contact area to form a first leadwire and then back to an adjacent bond pad to form an adjacent leadwire extending to a corresponding adjacent leadframe contact area. Each wirebond is made sequentially around the die in a continuous loop from one bond pad to an adjacent bond pad, so as to minimize the total distance travelled and thus reduce the total wirebonding time.

Generally, contact areas on leadframe fingers of a conventional IC package are spaced apart a greater distance than the corresponding bond pad pitch of the die In a packaged die, the resulting arrangement of bonded leadwires diverge, or fan out, from the bond pads on the die towards the lead fingers, with an increasing fan out angle towards the corners of the die package. Thus, in general, leadwires extending near the centre line of each side of a rectangular die extend nearly perpendicularly from an axis defining a row of contact pads, but wires extending from pads near the corners fan out at angles approaching $\sim 45°$ or more relative to the leadwires near the centreline.

Consequently, towards the corners of the die, bonded leadwires may extend towards or even extend across neighbouring pond pads. Thus, the minimum bond pad pitch should be sufficiently large to avoid undesirable electrical contact between a bonded leadwire and a neighbouring leadwire and bond pads. However, more significantly, if the bond pad pitch is not sufficiently large, access for the wirebonding tool to provide a wirebond on a bond pad adjacent an already bonded leadwire is restricted by an already bonded leadwire extending across the adjacent bond pad. In fine pitch wirebonding, problems due to wirebonding tool-to-wire interference may arise if the bond pad pitch is reduced. In known methods of wirebonding, the latter problem is most severe when wirebonding leadwires with large fan out angles, near corners of a die.

The shape and form of the wirebonding tool and the maximum diameter of the tool extending between adjacent wirebonds are thus important parameters in determining the minimum bond pad pitch. Conventional wirebonding tools for example as used for gold ball bonding, use capillaries having a simple 30° conical tapered end. In a known approach to reducing wire-to-tool interference for fine pitch bonding, there is now available a type of wirebonding tool called bottleneck capillary tool, which describes the form of the tapered end which narrows from a broader shoulder to a narrower end of a tubular conical form having a $\sim 10°$ taper. A bottleneck capillary tool, with its less tapered end and smaller maximum diameter, can approach a neighbouring leadwirebond more closely than a conventional tapered capillary. Thus the minimum bond pitch which can be made without damaging an adjacent wirebond is reduced. Theoretically, based on purely geometrical considerations, an available capillary wirebonding tool, for example, K&S 41490-Bottleneck Tailless Thermosonic Capillary for use with 1 mil gold wire, may be centred only 4.5 mil (112 $\mu$m) from an adjacent bonded leadwire. However, a finite clearance between an already bonded leadwire and the capillary bonding tool is necessary to prevent breakage of previously bonded wires or damage to the delicate fine tip capillary bonding tool.

Furthermore, during wirebonding using known wirebonding apparatus, there is a statistical variation in placement of a bond on a pad. Ideally, each bond is o centred on a bond pad, but there is a limitation on the machine and operator accuracy for known wirebonding apparatus which may result in a variation of as much as $+/-20$ $\mu$m and typically $+/-10$ $\mu$m, in placing a bond on a pad. Consequently, the practical limit on the minimum bond pad pitch is greater than that calculated from purely geometrical considerations, i.e. based on the dimensions of the wirebonding tool and the loop profile of a bonded leadwire. A practicably achievable minimum bond pad pitch must take into account factors including wirebonding tool geometry, and placement accuracy of the wirebonding apparatus. Thus, with conventional wirebonding apparatus, wire-to-tool interference is a significant limitation to reduction of the bond pad pitch, particularly for leadwires with large fan out angles, near the corners of a die.

In a method as described in copending U.S. patent application Ser. No. 07/957,955 filed on Oct. 8, 1992 to Simpson, entitled "Semiconductor Die With Variable Bond Pad Pitch", a die is provided with variable bond pad spacing, i.e. the spacing of the bond pads is a minimum at the centre of each side of a die for wires with a fan out angle of zero where tool-to-wire interference is minimized and the bond pad pitch increases towards corners of a die with increasing fan out angle. Thus the dimensions of a die may be reduced, while ensuring for wirebonding leadwires with larger fan out angles.

However, for conventional wirebonding apparatus, wire-to tool interference remains a significant limitation on the reduction of bond pad pitch, particularly for leadwires with large fan out angles near the corners of a die.

SUMMARY OF THE INVENTION

The present invention seeks to provide an apparatus and a method of wirebonding which avoids or reduces the above mentioned problems.

According to one aspect of the present invention, there is provided a method of wirebonding to provide individually bonded leadwires between bond pads spaced apart in a series along an axis on a semiconductor die and individual contact areas of a series of contact areas spaced from the axis and provided on a substrate, and wherein the bonded leadwires fan out from the series of bond pads towards the contact areas with the angle subtended between the bonded leadwires and the axis decreasing progressively from leadwire to leadwire from a position intermediate ends of the series of bond pads towards each end of the series, the method comprising: progressively from one end of the series of bond pads, forming bonded leadwires between the bond pads and their corresponding individual contact areas towards a specific location between ends of the series; and progressively from the other end of the series and towards the specific location, forming bonded leadwires between the bond pads and their corresponding individual contact areas.

Thus, in a method of wirebonding of leadwires to a series of bond pads, wirebonding proceeds in a predetermined sequence from ends of the series towards a specific intermediate position in a direction of decreasing fan out angle, so that an already bonded leadwire is angled away from an adjacent bond pad to which a subsequent wirebond is made. Thus wirebonding tool-to-wire interference is reduced or avoided.

According to another aspect of the present invention there is provided a method of wirebonding to provide individually bonded leadwires between a rectangular array of bond pads of a semiconductor die and individual contact areas provided on a substrate, each side of the rectangular array of bond pads comprising a series of bond pads spaced apart along an axis, with corresponding contact areas of the substrate spaced from the axis, wherein the bonded leadwires fan out from each series of bond pads towards their corresponding contact areas, with the angle subtended between a bonded leadwire and the axis decreasing progressively from leadwire to leadwire from a position intermediate ends of said series of bond pads towards each end of said series located at corners of the rectangular array, and the method comprising: progressively from one end of a series of bond pads at a corner of the array forming bonded leadwires between bond pads and their corresponding individual contact areas in a direction towards a specific location; and then progressively from the other end of the series at another corner of the array in a direction towards the specific location, forming bonded leadwires between the bond pads of the series and their corresponding individual contact areas.

Thus, for example, where the die comprises a square array of bond pads, arranged in rows along each side of a square die, as used in a QFP, the wirebonding sequence preferably proceeds through a series of bond pads along each side of the die in two groups, the first group comprising pads extending from one corner towards a centre line and then the other group comprising pads extending in a direction from the other corner towards the centre line, with the bonding sequence being in opposite directions through the two groups from the corner towards the centreline. Thus, it is possible to reduce the minimum corner pad pitch while avoiding damage to the adjacent wire during bonding. During wirebonding of each group of pads, the wirebonding tool moves to the adjacent pad located on the side from which the previously bonded leadwire is angled away from the adjacent pad, i.e. to the side of the previously bonded wire which provides greater access for the bonding tool. Although the total bonding time per die is increased by the increased path length travelled to reposition the wirebonding tool at the beginning of each group which is bonded in an opposite loop direction to the previous group, an advantage is gained in that reduced clearance between bonded leadwires and adjacent bond pads at larger fan out angles near corners of the die does not cause restriction of the minimum bond pitch for large fan out angles relative to the minimum bond pad pitch for bondwires with near zero fan out angle.

Consequently the area of a die may be significantly reduced: for example the minimum pad pitch using variable pad spacing can be approximately 5 mil for centre pad and 6.3 mil for corner pads, compared with 8 mil using a conventional bonding sequence with the same wirebonding tool and apparatus. In applications where the "wire-crossing-pad" criteria may be waved, application of a method according to the invention may allow a uniform bond pad pitch of ~5 mil to be used around the whole die with a corresponding further reduction in die size.

According to another aspect of the present invention there is provided a wirebonding apparatus for providing individually bonded leadwires between bond pads spaced apart in a series along an axis on a integrated circuit die and corresponding individual contact areas of a series of contact areas spaced from the axis and provided on a substrate, whereby the bonded leadwires fan out from the series of bond pads towards the contact areas with the angle subtended between the bonded leadwires and the axis decreasing progressively from leadwire to leadwire from a position intermediate ends of the series of bond pads towards each end of the series, the apparatus comprising: positioning means providing a support for locating a substrate carrying an integrated circuit die; wirebonding means comprising a wirebonding tool; the positioning means and the wirebonding tool being relatively moveable to align the wirebonding tool with any one of a plurality of first bonding coordinates corresponding to bond pads on the die for forming a first wirebond and subsequently with a respective one of a plurality of second bonding coordinates corresponding to a contact area of the substrate for forming a second wirebond thereby forming a bonded leadwire between a bond pad and a corresponding individual contact area; means to control the relative movement of the bonding tool and the support and of the operation of the wirebonding tool to provide wirebonds sequentially at each of said first and second bonding coordinates in a predetermined sequence, said predetermined sequence comprising progressively from one end of the series of bond pads, forming bonded leadwires between the bond pads and their corresponding individual contact areas towards a specific location between ends of the series, and then progressively from the other end of the series and towards the specific location, forming bonded leadwires between the bond pads and their corresponding individual contact areas.

Advantageously, the wirebonding apparatus comprises means for inputting and storing a plurality of bonding coordinates, means for evaluating a decision parameter value related to the wirebonding yield for each of a plurality of bonding sequences, and means for selecting one of said plurality of bonding sequences dependent on the decision parameter value.

Thus, the control means is operable, either automatically or under operator control, to implement a selected one of the plurality of predetermined wirebonding sequences to provide optimum wirebonding yield for a particular arrangement of leadwires.

An apparatus according the invention provides for wirebonding of series of leadwires interconnecting bond pads of a die and contact areas of a substrate in a sequence other than a continuous loop around the die. Preferably, the apparatus is operable to relatively position the bonding tool and the support at any one of a plurality of desired bonding locations so that in bonding leadwires for a packaged IC having a rectangular format such as a PQFP, the bond wires may be provided in a sequence progressively through groups of bond pads in order of decreasing fan out angle, so as to minimize tool-to-wire interference.

Thus, the present invention provides a method of wirebonding and an apparatus for wirebonding in which the above mentioned problems are reduced or avoided.

BRIEF DESCRIPTION OF THE DRAWINGS

An embodiment of the invention will now be described by way of example, with reference to the accompanying drawings, in which:

FIG. 3b shows a corresponding top view of the two leadwires and wirebonding tool shown in FIG. 3a;

FIGS. 4b, 4c and 4d show an enlarged view of part of the structure of FIG. 4 at successive stages of wirebonding in the sequence of FIG. 4a;

DESCRIPTION OF THE PREFERRED EMBODIMENT

Figure 1:
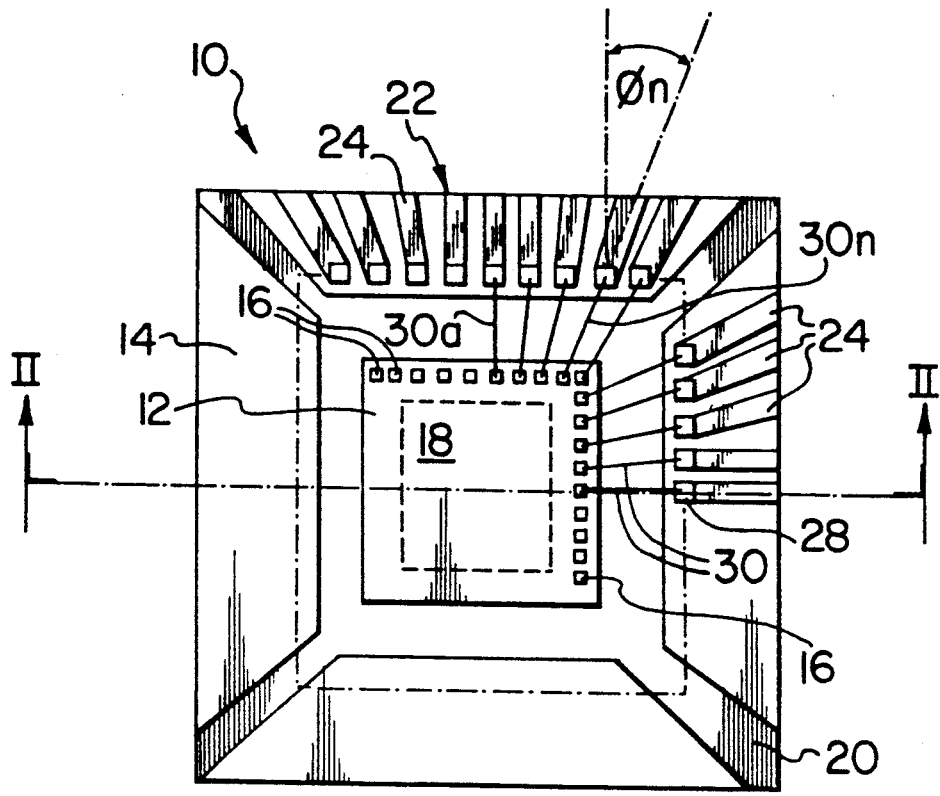
FIG. 1 shows schematically a conventional known arrangement for packaging and wirebonding an integrated circuit die.
Figure 2:
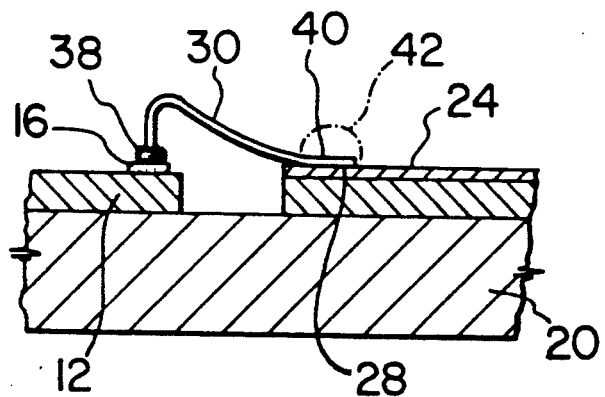
FIG. 2 shows an enlarged cross sectional view of part of FIG. 1, through arrow II—II.

A conventional arrangement 10 for packaging a semiconductor die 12 mounted within a package 14 is shown schematically in FIG. 1. The die 12 is of a conventional known square format, such as that used in a PQF package. The die 12 has a plurality of, for example, 256 contact areas in the form of bond pads 16, arranged in a square array around sides of the die and surrounding an area 18 on which are defined components of the integrated circuit (not shown). Conductive lines (not shown) of the integrated circuit provide electrical connections with the bond pads 16. The package 14 provides an insulating substrate 20 and a conductive leadframe 22 having a plurality of spaced apart leadframe fingers 24 each providing a contact area 28. A plurality of (i.e. 256) leadwires 30 extend between individual corresponding bond pads 16 and contact areas 28 of conductive leadframe fingers 24 of the package. The leadframe fingers 24 provide electrical connections to exterior contact terminals (not shown) of the package 14. The centre-to-centre spacing of the contact areas 28 on leadframe, which is generally termed the wedge pitch, is greater than the bond pad pitch. Consequently, the leadwires 30 diverge or fan outwards towards the leadframe fingers 24. For example, as shown in FIG. 1, the angle between a wire 30a, which extends perpendicularly from the axis 32 through the linear array of bond pads 16 along one side, and, another wire, e.g. 30n, is termed as the fan out angle $\phi_n$. The bonded leadwires extending from a series of bond pads along one side of the die thus fan out with increasing fan out angle from the centre of the series towards ends of the series at corners of the array of bond pads. Conversely, the angle subtended between the bonded leadwires and the axis of the series of bond pads decreases from leadwire to leadwire from an intermediate position towards ends of the series at the corners of the array of bond pads.

Figure 3A:
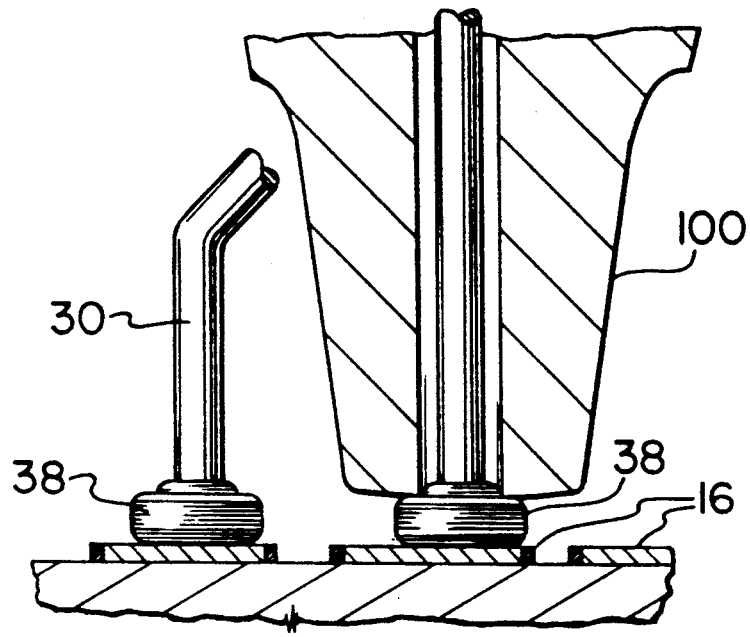
FIG. 3a shows a cross-sectional view through a known prior art capillary bonding tool in use in a conventional process of wirebonding.
Figure 3B:
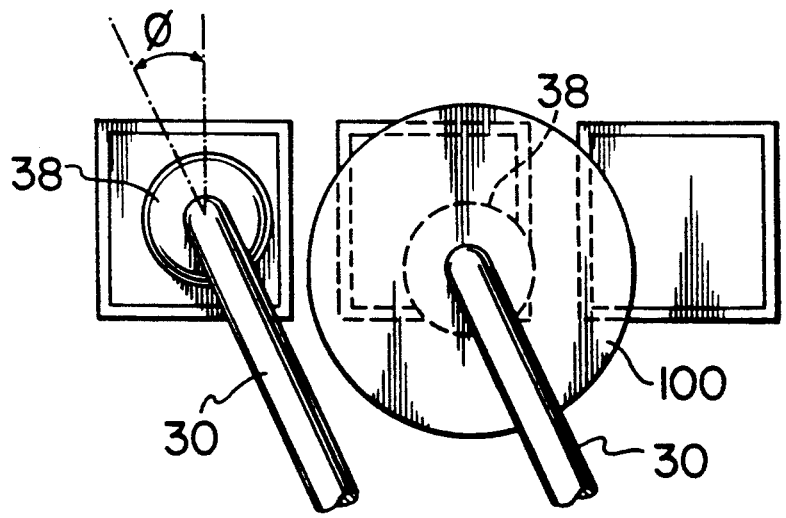

In a conventional known method of capillary wirebonding, for example by gold ball bonding using a capillary wirebonding tool as shown in FIGS. 3a and 3b, a wirebond between a bond pad 16 of the die and a corresponding contact area 28 of a leadframe finger is provided by the following sequence of operations. A gold wire 102 is guided from a supply reel through a capillary wirebonding tool 100. The capillary wirebonding tool 100 is aligned relative to a first bonding pad 16 of the die 12 in a retracted position spaced from the bonding pad 16, and a bond wire ball is formed on a free end of the wire by heating and melting the free end of the wire and the ball is brought into contact with the bonding pad by relatively moving the tool and the die together, and the wire ball 38 is bonded to the bond pad by application of a combination of heat, pressure and/or ultrasonic assistance. The resulting gold ball bond 38 has a form as illustrated in FIG. 3. After retracting the wirebonding tool, allowing the bond wire to pass through the capillary and extend to form a loop in the bond wire of predetermined length with a portion of the wire extending through the end of the capillary, the capillary wirebonding tool 100 and the die are relatively moved to align a selected portion of the bond wire 40 with a corresponding first leadframe contact area 28, and the selected portion of wire 40 is brought into contact with the leadframe contact area 38 to form a wedge bond 42 between the wire and the leadframe 28. The wirebonding tool 100 is then retracted and the bond wire is clamped and pulled to sever the bonded leadwire 30 from the supply. The wirebonding process continues by relative movement of the wirebonding tool and the die to align a newly formed gold wire ball with an adjacent second bond contact pad and then a second wirebond is provided between the second bond pad and a individual corresponding second leadframe contact area.

These process steps are repeated sequentially for each adjacent bond pad, so that each bond pad 16 is electrically connected by an appropriate length of leadwire 30 to a corresponding individual leadframe contact area 28, in a sequence looping around the die, so as to minimize the total bonding time. Control means of the wirebonding apparatus provide for automatic alignment of the wirebonding tool with bond pad and leadframe contact areas. By recording of bond locations taught by an operator during an initial manual bonding sequence, or by direct input of bonding coordinates to a memory of a microprocessor of the control means, the bonding sequence is controlled to proceed from corner to corner in a continuous loop around the die, for example, in the direction of arrows 1, 2, 3, 4 as shown in FIG. 4a so that the bonding tool moves sequentially to each adjacent bond pad around the die until all pads are bonded.

Figure 4A:
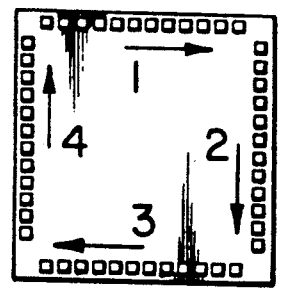
FIG. 4a shows schematically a conventional sequence of wirebonding according to a known prior art method.
Figure 4B:
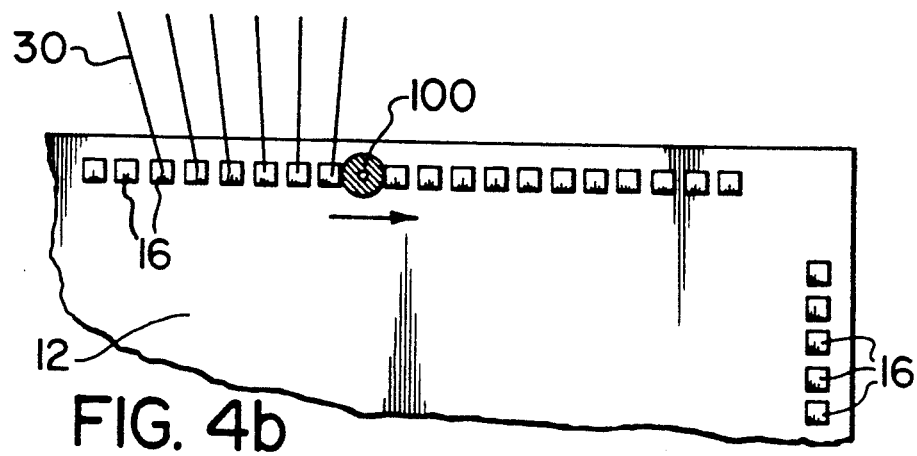
Figure 4C:
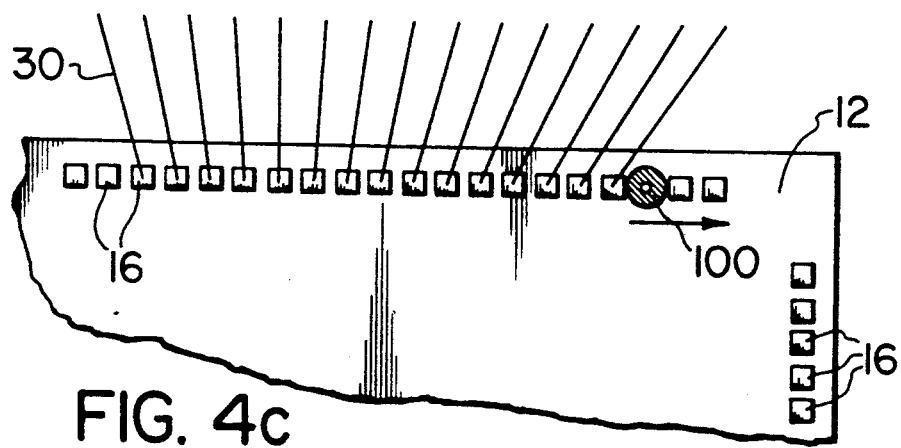
Figure 4D:
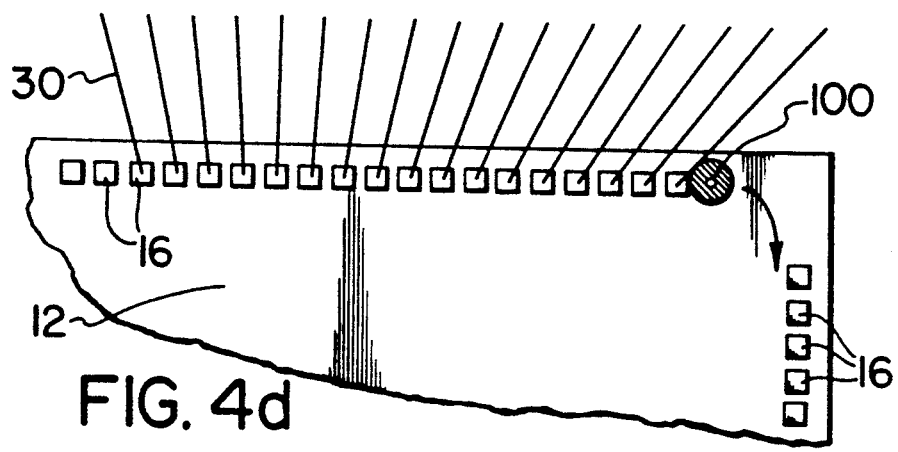

As the wirebonding proceeds from a pad near the die centre, FIG. 4a, towards the die corner, FIG. 4d, access for the wirebonding tool becomes increasingly limited. The wire-to-tool interference becomes more severe as the fan out angle increases towards the die corner, and a wire from the previous bond is angled towards and may lie across the area surrounding the adjacent bond pad, thereby limiting access for the bonding tool to make the next ball bond. If the bond pad pitch is not large enough, wirebond failure may result from leadwire breakage. Thus the minimum pad pitch is limited by the wire-to-tool clearance at the corner pad (FIG. 4c).

Figure 5:
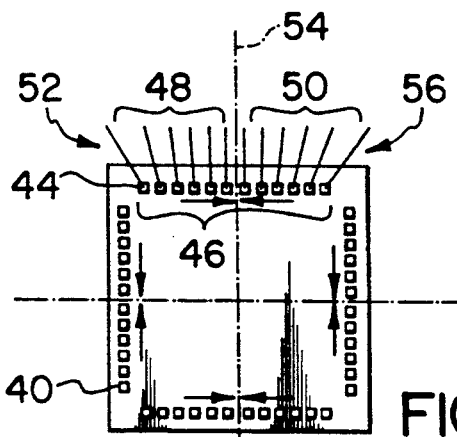
FIG. 5 shows schematically a method of wirebonding according to an embodiment of the present invention.
Figure 6A:
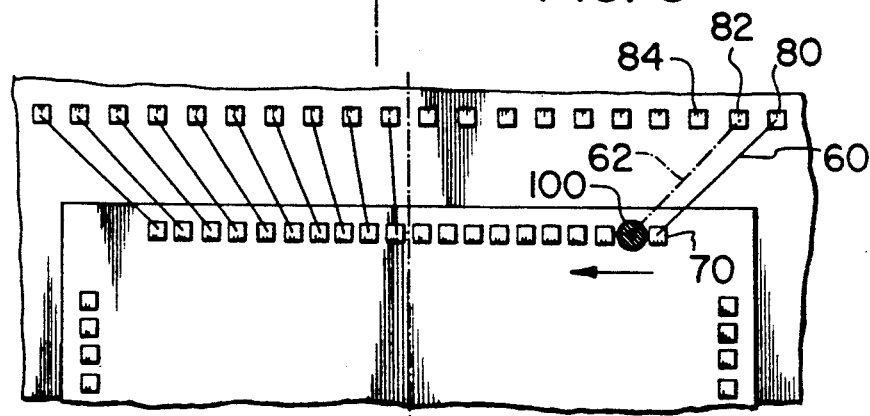
FIGS. 6a, 6b and 6c show an enlarged view of part of the structure of FIG. 5 at successive stages of wirebonding.
Figure 6B:
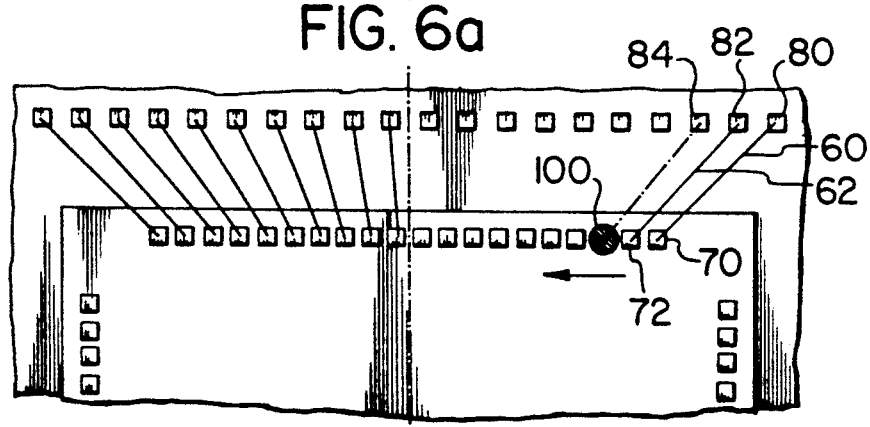
Figure 6C:
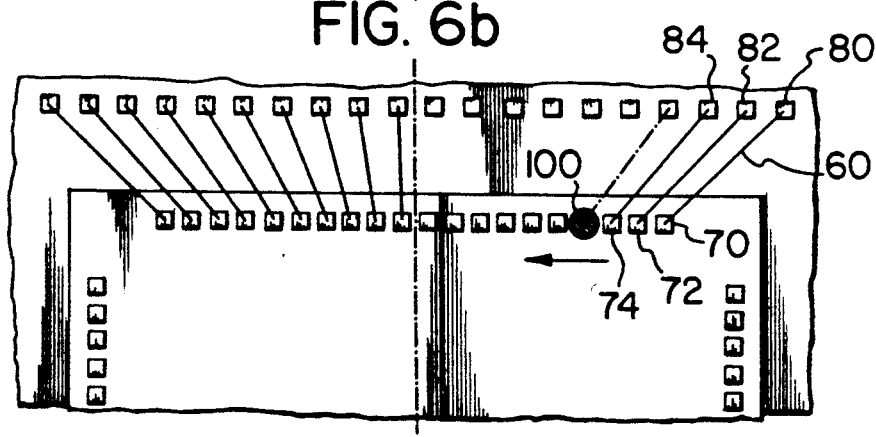
Figure 7:
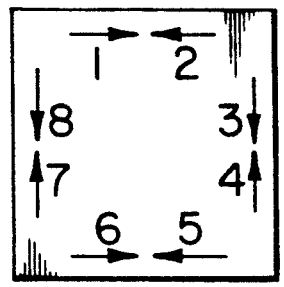
FIG. 7 shows a first sequence of wirebonding according to the embodiment of the present invention.

In a method of wirebonding according to an embodiment of the present invention, wirebonds 60 are provided to a series 46 of bond pad along each side of an integrated circuit die 40 in a sequence as shown in FIGS. 5 and 6. The sequence of wirebonding proceeds progressively through bond pads 44 from one end 52 of the series 46 towards a specific position 54 intermediate ends of the series, and then progressively from the other end 56 of the series towards the specific position 54. For a symmetrical array of bondwires, as illustrated in FIGS. 5 to 7 for a rectangular die, the specific position 54 corresponds to the centre position along one side of the die from which the resulting bonded leadwires fan outwards. Ends 54 and 56 of the series 46 are located near adjacent corners of the die. Thus, wirebonding proceeds to form bonded leadwires in a sequence in a direction of diminishing fan out angle. For a die 40 having a rectangular array of bond pads 44, as shown in FIG. 5, each linear series of pads 46 along one side of a die is bonded in two groups 48 and 50: the first group 48 comprises bond pads extending between one corner 52 and a centreline 54 of the side, and the second group 50 extends between the other corner 56 and the centreline 50 of that side. Each leadwire 69 of a group is bonded sequentially in a direction from a corner towards the centreline. In this way, after completion of a first wirebond 60 between a first bond pad 70 and a leadframe contact 80 which extends angularly from the first bond pad 70 (FIG. 6a), the wirebonding tool is moved so as to be located on the adjacent bond pad 72 where the previously bonded leadwire 60 is angled away from the said adjacent bond pad 72, and that access of the tool to the adjacent pad 72 is not restricted by the leadwire of the wirebond previously made (FIGS. 6b and 6c).

Where the die comprises a square array of contact pads as shown in FIG. 5, with a linear series of bond pads along each side of a rectangular die, a preferred sequence of bonding around all four sides of the die proceeds in two passes in opposite directions along each side, for example, as shown by arrows 1 to 8 in FIG. 7. Compared with a conventional continuous looping sequence around the die, the total bonding time per side is increased by performing wirebonding in a discontinuous loop around the die, because of the increased distance travelled during relocation of the bonding tool at the beginning of the second pass c. However, tool to-wire interference is independent of the fan out angle, because a previously bonded wire is always angled away from the adjacent bond pad to which the subsequent wirebond is to be made (i.e at an angle greater than 90°). Consequently, the minimum bond pad pitch based on tool-to-wire interference is independent of fan out angle.

Figure 8:
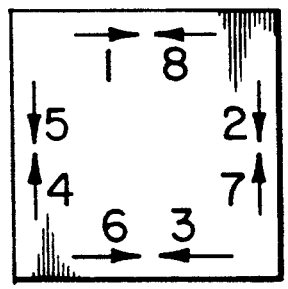
FIG. 8 shows a second sequence of wirebonding according to the embodiment of the present invention.

An alternative sequence for wirebonding a square array of bond pads is as shown by arrows 1 to 8 in FIG. 8. The leadwires are provided in a first pass in one loop direction, (e.g. clockwise) to four groups of bond pads extending from a corner to centre along each of the four sides in turn, and then in the second pass in an opposite loop direction to provide leadwires to bond through the remaining four groups of bond pads extending from corner to centre along each side.

In modifications of the embodiment, the specific position intermediate ends of each series of bond pads may be located at any selected position along the axis other than the centre, where the angle subtended between a bondwire and the axis is sufficiently large not to significantly restrict access of the wirebonding tool to neighbouring bond pads.

A Monte Carlo analysis of bond placement during wirebonding was carried out to investigate the importance of the process parameters, including wirebonding capillary tool dimensions and wire loop profiles, to wirebonding capabilities, and particularly to the limiting bond pad pitch due to tool-to-wire interference using known wirebonding apparatus. For a well designed package, the maximum fan out angle approaches 45° and may reach 55° after moulding, assuming 10% wire sweep.

Calculations were made for a series of bottleneck capillary wirebonding tools and for practically attainable loop profiles. The thinned section of the available bottleneck capillary tools was 457 $\mu$m or 18 mil high, so that the reduction of the loop height to 381 $\mu$m (15 mil) avoids interference of the wire loop with the shoulder of the capillary. Although, ideally the ball should be placed centrally within the pad opening, there may be mechanical and operator placement accuracy of from $+/-10$ $\mu$m to $+/-20$ $\mu$m ($+/-0.8$ mil) which leads to a statistical variation in placing a bond on a pad. A criterion requiring 100% placement of a bond on a pad without overlap avoids ball-bond to ball-bond shorting. Based on these assumptions, the analysis found that tool-to-wire interference for gold ball-wedge bonding at larger fan out angles is a more significant limitation to reducing the minimum bond pad pitch than criteria for minimizing wire-to-pad crossing, wire-to-wire crossing, and error in placement of a bond on a pad.

By use of the method according to the invention, a significant reduction in minimum bond pad pitch and increase in bond pad density can be achieved, because tool-to-wire interference is avoided or reduced and the minimum bond pad pitch is independent of the leadwire fan out angle. Thus a uniform minimum bond pad pitch value calculated to avoid tool-to-wire interference for a fan out angle of zero can be used around the die, and there is no need to increase the pad pitch near the corners to avoid wire-to-tool interference.

Consequently, by using a bonding sequence according to an embodiment of the method of the invention, the die size required to accommodate 256 I/O connections to a square die is reduced to 416 mil (10.56 mm) on a side, compared with 471 mil (11.95 mm) on a side using a conventional corner-to-corner bonding sequence. This die size reduction provides a 22% reduction of die area and a consequent increase in number of dice per 6" wafer from about 90 to 117. Hence, die yield per wafer is significantly increased, with a corresponding decrease in the processing cost per die.

Other modifications of the method according to the embodiments may be used for wirebonding of other arrangements of bond pads and contacts including semiconductor dies (i.e. chips) or other semiconductor devices having non-linear arrays of bonding pads and for wirebonding semiconductor dies to arrays of contact areas on other types of substrate, for example, substrates of multi-chip modules.

A method of wirebonding according to the invention is also applicable for wedge-wedge wirebonding, e.g. ultrasonic aluminium wedge bonding for hermetically sealed packages. In wedge bonding, the profile of the leadwire has lower loop height and a tail extends beyond each wedge bond. A tail of wire may extend towards and overlap an adjacent bond pad or touch an adjacent wire, i.e. wire-to-pad crossing. Thus, wire-to-pad crossing at large fan out angles is a more significant limitation to minimizing bond pad pitch in wedge bonding compared with gold ball bonding. Wire-to-pad crossing is less likely to result in shorting for gold ball bonding because the initial leadwire loop profile is steep. Although wire-to pad crossing in wedge bonding limits the minimum bond pad pitch, the limitation from bonding tool-to-wire interference may be reduced by wirebonding according to the method of the embodiment described above.

Figure 9:
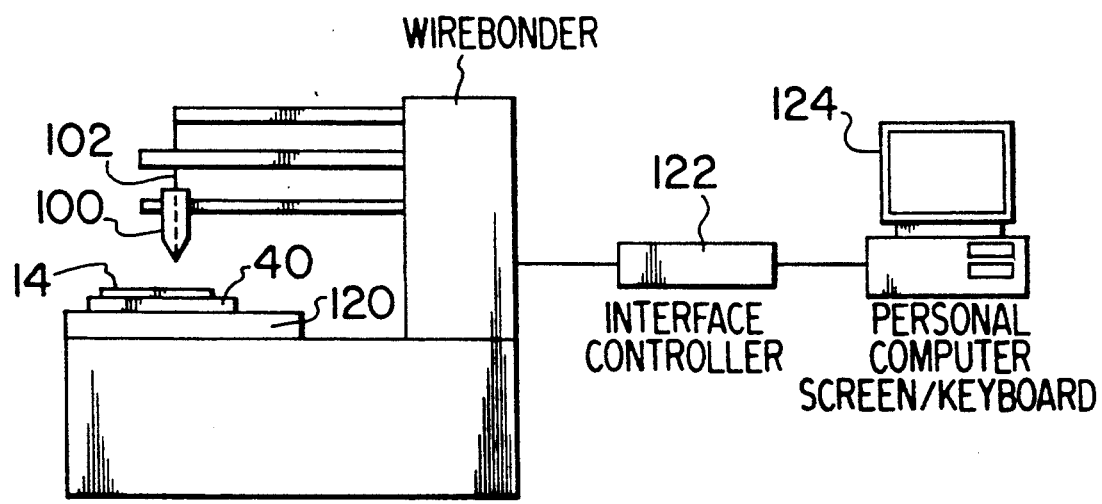
FIG. 9 shows a schematic diagram of the apparatus according to the embodiment.

An apparatus for wirebonding according to an embodiment of the present invention comprises a wirebonding station providing a die positioning means including a conventional support 120 on a moveable stage for locating a substrate, i.e. a IC die package 40, and a wirebonding means which comprises a conventional capillary wirebonding tool 100 (FIG. 9). The apparatus includes linear motion stages (not shown) with drive means for movement of the support and means to control the operation and relative movement of the wirebonding tool and the support during wirebonding.

The control means comprises a computerized controller 122, having memory for storage of bonding coordinates, together with the necessary hardware and software interfaces for controllably operating the drive means for relatively moving the wirebonding tool and the support in sequence with wirebonding operations of the wirebonding tool. The capillary wirebonding tool and the support are thus relatively moveable to each of a plurality of first and second wirebonding coordinates, and from positions apart to positions closer together for forming wirebonds at each of said first and second wirebonding coordinates in one or more predetermined sequences.

The selection of bonding sequence is either fully automatic, or operator controlled. The computer 124 of the control means comprises known means for inputting and storing bonding coordinates. Input of coordinates of bond pads is provided initially by an operator teaching the coordinates manually, i.e. during a manual wirebonding operation in which coordinates are recorded in memory of the computer in order of the manual operation, or alternatively, by direct input of an ordered sequence of coordinates to the computer memory in digitized format, i.e. from a magnetic diskette.

The controller provides for evaluating a decision parameter value related to the probability of failure due to tool-to-wire interference (i.e. related to wirebonding yield) for bonding a leadwire between each corresponding bond pad and contact area for each of a plurality of bonding sequences. The plurality of bonding sequences for wirebonding a square die in a PQF package may comprise, for example, two alternative sequences, that is, a corner-to-centre sequence as described in the embodiments above, and a conventional continuous loop sequence around the die. An appropriate sequence is selected depending on the decision parameter values for each sequence.

Figure 10A:
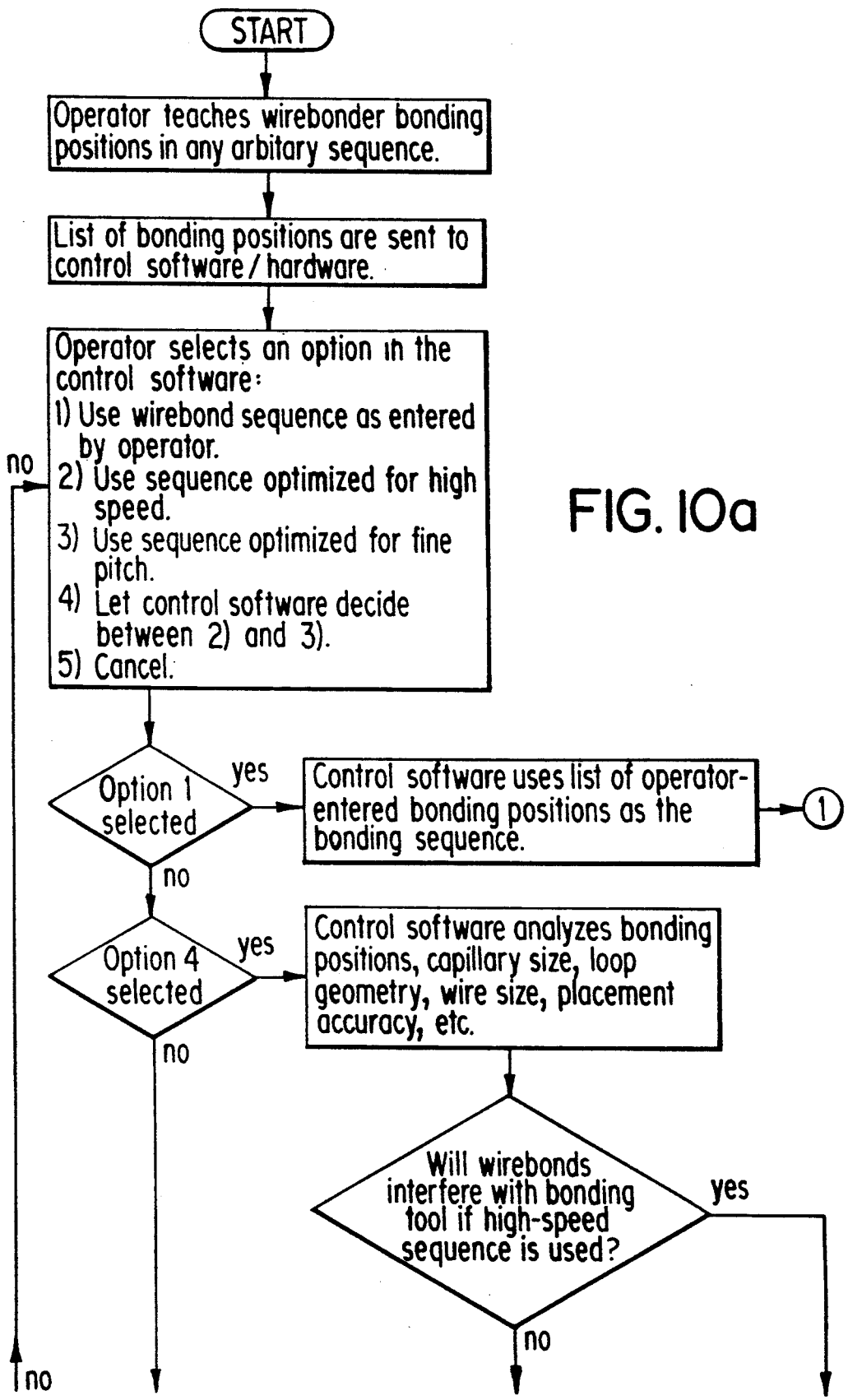
FIGS. 10a and 10b show a flow diagram for operation of an apparatus according to the embodiment.
Figure 10B:
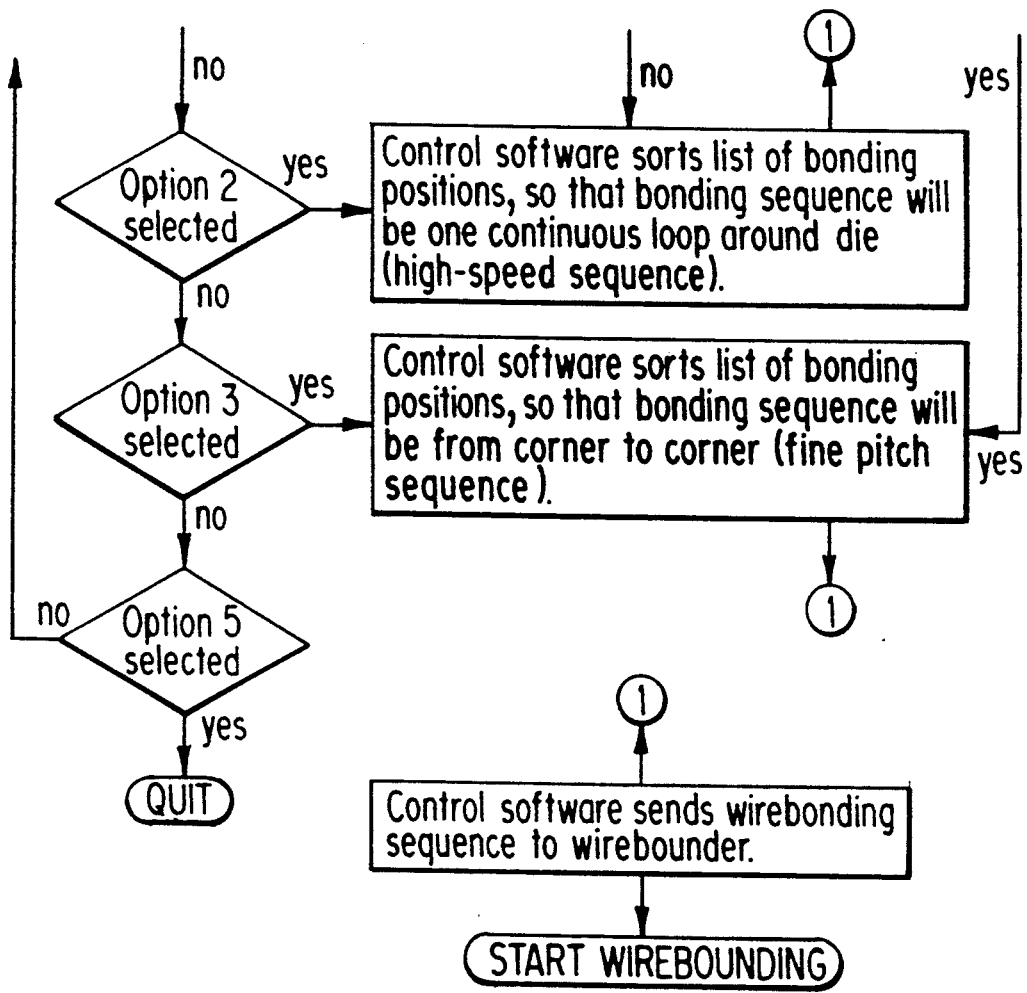

The selection of an appropriate bonding sequence is either fully automatic, or operator controlled. FIG. 10 shows a flow chart illustrating the operations performed by the controller under operator instruction. After inputting the bonding coordinates, the wirebonding apparatus provides for an operator to choose one of a number of options for selecting an appropriate bonding sequence (FIG. 10) to allow for optimizing the wirebonding yield for a particular wirebonding configuration. Advantageously, the hardware and software for storage of the bonding coordinates provides for evaluation of the bonding coordinates to determine if the probability of tool-to-wire interference exceeds a predetermined threshold value for a selected bonding sequence. If the decision parameter value is within a predetermined range for a preferred bonding sequence, for example, a high speed conventional bonding sequence proceeding in a single continuous loop around the die to minimize bonding time, the latter sequence is implemented. However, if the decision parameter falls outside the predetermined range, i.e. if the probability of tool-to-wire interference is predicted to cause lower than desirable yield, an alternative bonding sequence to minimize wirebonding tool-to-wire interference for fine pitch wirebonding is implemented, i.e. the corner-to-centre sequence described above. The desired sequence is executed by causing the controller to sort the bonding coordinates to provided the selected bonding sequence and sending instructions to the wirebonder to perform wirebonding in the selected sequence.

For example, based on calculations of the Monte Carlo analysis of bonding mentioned above, a limit value for the minimum bond pad pitch for a given fan out angle for a particular apparatus and wirebonding tool may be calculated, taking into account selected machine parameters including wirebonding tool dimensions, lead dimensions, and bond placement accuracy. From the stored bonding coordinates, the lead bond positions are predicted and assessed to determine if wirebonding tool-to-wire interference would occur during a high speed bonding sequence which proceeds in a continuous loop around the die. If tool-to-wire interference is predicted to occur only below a six sigma level, or other selected yield level, the bonder performs a high speed bonding sequence in a continuous loop in a conventional manner. If calculations indicate that bonding in a conventional sequence is hindered by tool-to-wire interference which would increase probability of failure above the desired level, a wirebonding sequence to minimize tool-to-wire interference is calculated. For example, for wirebonding a rectangular array of bond pads and contact areas, a preferred sequence is the corner-to-centre sequence, as is described above. The control means sorts the list of bonding coordinates and outputs the ordered bonding coordinates so as to cause the wirebonder to perform a corner-to-centre bonding sequence, and thus minimize tool-to-wire interference.

Thus, a wirebonding sequence may be selected for a particular combination of die and package to improve wirebonding yield for fine pitch wirebonding, or where pad pitch is sufficiently large, to select a high speed bonding sequence. The apparatus further provides for rapid changeover from one product to another by selection of an appropriate wirebonding sequence based on the particular bonding coordinates and desired wirebonding yield parameters.

Preferably, the wirebonding tool and the support are relatively moveable between first and second bonding coordinates forming in a rectangular square array, wherein the sequence of wirebonding along each side of the array occurs in a first pass from one corner of the array towards the centre line of a side and then in a second pass from the opposite direction in a second pass from the other corner towards centre line of the said side.

While the control means may comprise a separate controller as illustrated in FIG. 9, which interfaces with a conventional wirebonding apparatus and operates to implement the control sequences to allow instructions for one of a plurality of bonding sequences to be sent to and performed by the wirebonder, the control means may alternatively form part of an integral wirebonding apparatus.

Thus, the apparatus of the present invention is operable to perform alternative bonding sequences, in one of a plurality of predetermined looping sequences in anticlockwise or clockwise direction through a series of bond pads, dependent on the coordinates of bond pads relative to contact areas of the substrate, so as to avoid or reduce tool-to-wire interference. Problems with wirebonding tool-to-wire interference in a conventional wirebonding sequence, which proceeds sequentially in one continuous loop direction around a die are avoided. Although wirebonding time may be increased, wirebonding with reduced bond pad pitch can be achieved with improved yield.

What is claimed is:

1. A method of wirebonding to provide individually bonded leadwires between bond pads spaced apart in a series along an axis on a semiconductor die and individual contact areas of a series of contact areas spaced from the axis and provided on a substrate, and wherein the bonded leadwires fan out from the series of bond pads towards the contact areas with the angle subtended between the bonded leadwires and the axis decreasing progressively from leadwire to leadwire from a position intermediate ends of the series of bond pads towards each end of the series, the method comprising:
    progressively from one end of the series of bond pads, forming bonded leadwires between the bond pads and their corresponding individual contact areas towards a specific location between ends of the series; and
    progressively from the other end of the series and towards the specific location, forming bonded leadwires between the bond pads and their corresponding individual contact areas.

2. A method according to claim 1 wherein the specific location comprises said position intermediate ends of the series.

3. A method according to claim 1 wherein the series of bond pads form a part of a rectangular array of a plurality of bond pads of a semiconductor die, each side of the rectangular array comprising a series of bond pads, and, the substrate provides spaced apart corresponding contact areas, the method of wirebonding comprising providing bonded leadwires sequentially to each series of bond pads.

4. A method according to claim 1 wherein the series of bond pads forms one side of a rectangular array of bond pads on the semiconductor die and corresponding contact areas of the substrate form one side of a rectangular array of contact areas surrounding the semiconductor die, and the method comprises forming bonded leadwires to the series of bond pads along a side of the rectangular array, whereby bonded leadwires of each series are provided progressively from a corner of the array towards an intermediate position of a series corresponding to an intermediate position along a side of the array.

5. A method according to claim 1 wherein the substrate comprises part of a semiconductor die package and contact areas are provided on a leadframe of the package.

6. A method of wirebonding to provide individually bonded leadwires between a rectangular array of bond pads of a semiconductor die and individual contact areas provided on a substrate, each side of the rectangular array of bond pads comprising a series of bond pads spaced apart along an axis, with corresponding contact areas of the substrate spaced from the axis, wherein the bonded leadwires fan out from each series of bond pads towards their corresponding contact areas, with the angle subtended between a bonded leadwire and the axis decreasing progressively from leadwire to leadwire from a position intermediate ends of said series of bond pads towards each end of said series located at corners of the rectangular array, and the method comprising:
    progressively from one end of a series of bond pads at a corner of the array forming bonded leadwires between bond pads and their corresponding individual contact areas in a direction towards a specific location; and then progressively from the other end of the series at another corner of the array in a direction towards the specific location, forming bonded leadwires between the bond pads of the series and their corresponding individual contact areas.

7. A method according to claim 6 wherein the specific location of a series corresponds to said position intermediate ends of said series.

8. A method according to claim 6 wherein the step of forming a bonded leadwire comprises:
   forming a first wirebond between an end of a length of leadwire and a bond pad;
   forming a loop of wire extending to a corresponding contact area; and
   forming a second wirebond between the wire loop and the corresponding contact area.

9. A method according to claim 8 wherein forming a first wirebond comprises forming a ball bond between the leadwire and the bond pad using a capillary bonding tool.

10. A method according to claim 8 wherein forming a second wirebond comprises forming a wedge bond between the length of leadwire and the contact area.

11. A method according to claim 8 wherein forming a first wirebond comprises forming a ball bond between the leadwire and the bond pad using a capillary bonding tool and wherein forming a second wirebond comprises forming a wedge bond between the leadwire and the contact area.

* * * * *